(12) United States Patent
Nishimura

(10) Patent No.: US 6,335,206 B1
(45) Date of Patent: Jan. 1, 2002

(54) INTEGRATED CAPACITOR DEVICE AND METHOD OF FABRICATING THE SAME

(75) Inventor: Isamu Nishimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/508,718

(22) PCT Filed: Jan. 20, 1999

(86) PCT No.: PCT/JP99/00193

§ 371 Date: Mar. 16, 2000

§ 102(e) Date: Mar. 16, 2000

(87) PCT Pub. No.: WO99/38203

PCT Pub. Date: Jul. 29, 1999

(30) Foreign Application Priority Data

Jan. 21, 1998 (JP) .......................................... 10-009433

(51) Int. Cl.⁷ .......................... H01L 21/00; H01L 21/20
(52) U.S. Cl. ............................ 438/3; 438/396; 438/484
(58) Field of Search ............................. 438/3, 59, 396, 438/586, 484, 766; 257/781, 295, 762, 769, 753

(56) References Cited

U.S. PATENT DOCUMENTS

| 4,759,823 A | * | 7/1988 | Asselanis et al. ........... 156/659 |
| 5,109,357 A | * | 4/1992 | Eaton, Jr. .................... 365/145 |
| 5,122,477 A | * | 6/1992 | Wolters et al. ................ 437/60 |
| 5,122,923 A | * | 6/1992 | Matsubara et al. ......... 361/321 |
| 5,187,638 A | * | 2/1993 | Sandhu et al. .............. 361/313 |
| 5,330,931 A | | 7/1994 | Emesh et al. ................. 437/60 |
| 5,510,651 A | | 4/1996 | Maniar et al. ............. 257/751 |
| 5,631,804 A | | 5/1997 | New .......................... 361/312 |

FOREIGN PATENT DOCUMENTS

JP 2-238672 9/1990

* cited by examiner

Primary Examiner—Michael Lebentritt
(74) Attorney, Agent, or Firm—Morgan, Lewis & Bockius LLP

(57) ABSTRACT

A method of fabricating a semiconductor device comprises the steps of forming an insulating layer on a semiconductor substrate including a first layer, forming a through hole in the insulating layer so as to reach for the first layer, charging an oxide dielectric substance into the through hole to form an oxide dielectric section therein, and forming a second layer on the oxide dielectric section.

21 Claims, 8 Drawing Sheets

INTEGRATED CAPACITOR DEVICE AND METHOD OF FABRICATING THE SAME

TECHNICAL FIELD

The present invention relates to a semiconductor device having oxide dielectrics, and also relates to a method of fabricating the semiconductor device.

BACKGROUND ART

A memory device incorporating a related ferroelectric condenser is known in the field of semiconductor devices having oxide dielectrics. This related ferroelectric condenser is composed such that a ferroelectric, which is a type of oxide dielectric, is interposed between an upper and a lower electrode. FIGS. 7A to 8B are cross-sectional views showing a related method of fabricating the related ferroelectric condenser used in the above-described memory device.

During fabrication of the related ferroelectric condenser, as shown in FIG. 7A, an insulating film 4 is formed on a substrate 2 having CMOS and other elements (not shown). A platinum layer 6 is then formed by depositing platinum on the insulating film 4 by means of sputtering. In the same manner, as shown in FIGS. 7B to 7C, a ferroelectric layer 8 and then a platinum layer 10 are formed on the platinum layer 6.

Next, as shown in FIG. 8A, an upper electrode 12 is formed by conducting RIE (Reactive Ion Etching) on the platinum layer 10, using a resist as a mask. In the same manner, as shown in FIGS. 8B to 8C, etching is successively conducted on the ferroelectric layer 8 and the platinum layer 6 using another resist (not shown) as a mask, so that a ferroelectric section 14 and a lower electrode 16 can be formed. Finally, an insulating film (not shown) is formed to cover the substrate 2.

However, problems associated with RIE etching may be encountered during fabrication of the related ferroelectric condenser. That is, the ferroelectric section 14 is formed by conducting RIE etching on the deposited ferroelectric layer 8. The RIE etching causes ions to shock the ferroelectric section 14, resulting in the ferroelectric section 14 having a tendency to develop a lattice defect. There is also a tendency for the RIE etching to cause a reducing reaction in the ferroelectric section 14. Accordingly, ferroelectricity, which is a function of the ferroelectric section 14, tends to deteriorate. These problems are especially serious in the case of a highly integrated memory device in which the area of the ferroelectric section 14 is small.

It is an object of the present invention to overcome the above-described problems by providing a semiconductor device characterized in that an operation of the oxide dielectric section (e.g., a ferroelectric) is seldom deteriorated. It is a further object of the present invention to provide a method of fabricating the semiconductor device.

In the related method of fabricating the related ferroelectric condenser, the following problems may be encountered. In order to prevent a product of etching (i.e., a side wall polymer), which is difficult to be removed, from adhering to a side 14a of the ferroelectric section 14 when RIE etching is conducted on the ferroelectric layer 8, a ratio of isotropic etching is set at a high value. Accordingly, the side face 14a of the ferroelectric section 14 is greatly inclined. This inclination results in the area required for the ferroelectric section 14 to be unnecessarily increased, which in turn obstructs the enhancement of the degree of integration of the semiconductor device into which the ferroelectric condenser is incorporated.

Further, when consideration is given to the fluctuation of the etching condition, it is necessary to provide a large margin between the ferroelectric section 14 and the upper electrode 12, or between the ferroelectric section 14 and the lower electrode 16.

It is another object of the present invention to solve the above problems by providing a semiconductor device having a degree of integration that can be easily enhanced. It is a further object of the present invention to provide a method of fabricating such a semiconductor device.

DISCLOSURE OF THE INVENTION

In the first aspect of the present invention, there is provided a method of fabricating a semiconductor device comprising the steps of: forming an insulating layer on a semiconductor substrate including a first layer; forming a through hole in the insulating layer so as to reach for the first layer; charging an oxide dielectric substance into the through hole to form an oxide dielectric section therein; and forming a second layer on the oxide dielectric section.

When an oxide dielectric substance is charged into the through hole, the oxide dielectric section, having the same shape as the internal shape of the through hole, is formed. Thus, the oxide dielectric section can be formed into a predetermined shape without etching. It is therefore possible to avoid the occurrence of a lattice defect and a reducing reaction, which are caused by etching the oxide dielectric section. As a result, the function of the oxide dielectric section is seldom deteriorated.

When the shape of the through hole is determined, the shape of the oxide dielectric section is thus determined. Accordingly, as compared with a case in which the shape of the oxide dielectric section is determined by etching, fluctuation of the shape of the oxide dielectric section is reduced. Therefore, it is possible to reduce a margin for absorbing the fluctuation and enhance a grade of integration of the device.

When the shape of the through hole is determined, a contact area between the first layer and the oxide dielectric section is thus determined. Accordingly, fluctuation of the contact area is reduced. In case it is constituted a condenser wherein the first layer serves as a lower electrode, capacity fluctuation thereof can be reduced.

In this connection, a method of forming the through hole in the insulating layer is not particularly restricted. For example, even when the well-known etching method is applied, the through hole can be formed with sufficiently high accuracy.

In the second aspect of the present invention, the method further comprises forming the first layer on an upper surface of the semiconductor substrate.

In the third aspect of the present invention the step of forming the oxide dielectric section includes the steps of laminating the oxide dielectric substance onto the insulating layer while filling the through hole therewith and removing the oxide dielectric substance located areas other than the inside of the through hole.

For example, the step of laminating the oxide dielectric substance is conducted by the sol-gel method and the step of removing the substance is conducted by the CMP (chemical mechanical polishing) method. Accordingly, the oxide dielectric section can be formed with significant ease.

In the fourth aspect of the present invention, the method further comprises the step of patterning the first layer before the step of forming the insulating layer.

Accordingly, in a process in which a layer arranged above the first layer (e.g., the second layer) is patterned by the etching, it is not necessary to conduct a patterning of the first layer lying in the lowermost. That is, in the above step of patterning, it is not necessary to etch deeply. Therefore, irregularities on the upper surface of the device are not so remarkable and can be flattened thereby.

In the fifth aspect of the present invention, the method further comprises the step of planarizing an upper surface of the insulating layer before the step of filling the through hole with the oxide dielectric substance.

Accordingly, when the oxide dielectric substance placed outside of the through hole is removed by, for example, the CMP method, the oxide dielectric substance can be easily and positively removed therefrom.

In the sixth aspect of the present invention, the method further comprises the step of patterning the first layer after the dielectric oxide dielectric section is formed.

Accordingly, in the step of forming the oxide dielectric section, the first layer has not been patterned yet, and the insulating layer formed on the first layer is flat. Therefore, when the oxide dielectric substrate placed outside of the through hole is removed by, for example, the CMP method, the oxide dielectric substance can be easily and positively removed therefrom.

In the seventh aspect of the present invention, the method further comprises the step of patterning the second layer so as to cover entire upper surface of the oxide dielectric substance.

Accordingly, even when the patterning is conducted by the etching, the oxide dielectric section is not affected by the etching. It is therefore possible to avoid the occurrence of a lattice defect and a reducing reaction, which are caused by the patterning of the second layer. As a result, the function of the oxide dielectric section is seldom deteriorated.

When the shape of the through hole is determined, a contact area between the second layer and the oxide dielectric section is thus determined. Accordingly, fluctuation of the contact area is reduced. In case it is constituted a condenser wherein the second layer serves as an upper electrode, capacity fluctuation thereof can be reduced.

In the eighth aspect of the present invention, an inner circumferencial wall of the through hole and the insulating layer make an angle of 80–90 degree.

Accordingly, in case it is constituted a condenser wherein the first layer serves as a lower electrode and the second layer serves as an upper electrode, such condenser having a predetermined capacity can be realized with a minimum projected plan area.

In the ninth aspect of the present invention, the step of forming the first layer includes the step of forming a first electrode on the upper surface of the semiconductor substrate in which a circuit element is formed.

In the tenth aspect of the present invention, the first layer is an impurity diffusion area formed on the upper surface of the semiconductor substrate.

Accordingly, a condenser having high reliability can be formed on the semiconductor substrate in which any desired circuit element is formed.

Further, since it is not necessary to conduct a patterning of the oxide dielectric substrate, deterioration of any circuit element arranged in lower layer can be reduced. Particularly, in case the first layer is an impurity diffusion area such as a drain or a source of a transistor, such deterioration of any circuit element arranged in the lower layer is reduced.

In the eleventh aspect of the present invention, the first layer includes a platinum layer.

In the twelfth aspect of the present invention, the first layer includes an iridium layer.

In the thirteenth aspect of the present invention, the first layer is two-layers film constituted by a lower layer made of platinum and an upper layer made of $IrO_2$.

In the fourteenth aspect of the present invention, the step of forming the through hole is conducted by RIE.

Accordingly, the through hole, the inner circumferencial wall of which is perpendicular to the first layer, can be easily formed with high accuracy.

In the fifteenth aspect of the present invention, the step of planarizing the upper surface of the insulating layer includes the steps of forming a SOG layer so as to fill recesses formed on the upper surface of the insulating layer by the SOG method and etching back an upper portion thereof.

In the sixteenth aspect of the present invention, the step of laminating the oxide dielectric substance is conducted by the sol-gel method and the step of removing the substance is conducted by the etching-back.

In the seventeenth aspect of the present invention, the step of laminating the oxide dielectric substance is conducted by the sputtering method and the step of removing the substance is conducted by the CMP method.

According to any one of the fifteenth to seventeenth aspects of the present invention, an accurate condenser having less fluctuation of capacity can be easily realized without damaging any lower layer.

In the eighteenth aspect of the present invention, there is provided a semiconductor device comprising: a first layer formed on an upper surface of a semiconductor substrate; an oxide dielectric section formed on the first layer, an outer peripheral side face of which is surrounded by an insulating layer such that the outer peripheral side face and the insulating layer make an angle of 80–90 degree; and a second layer is formed on the oxide dielectric section.

Accordingly, in case it is constituted a condenser wherein the first layer serves as a lower electrode and the second layer serves as an upper electrode, such condenser having a predetermined capacity can be realized with a minimum projected plan area. As a result, a device having a high grade of integration can be realized.

In the nineteenth aspect of the present invention, the first layer is an electrode including a platinum layer, and the first and second layers sandwich the insulating layer and the oxide dielectric section therebetween.

In the twentieth aspect of the present invention, the first layer is two-layers film constituted by a lower layer made of platinum and an upper layer made of $IrO_2$.

In the twenty-first aspect of the present invention, the oxide dielectric section is made of selected one of PZT, SBT and PLZT, and an ferroelectric condenser is constituted by the first and second layers and the oxide dielectric section.

In the twenty-second aspect of the present invention, the first layer is one of a source layer and a drain layer of a transistor, and an ferroelectric condenser is constituted by the first and second layers and the oxide dielectric section.

According to any one of the twentieth to twenty-second aspects of the present invention, a semiconductor device having high reliability and accuracy can be realized.

In this connection, hereinafter, "to form the first layer on the semiconductor substrate" or "to provide the first layer on the semiconductor substrate" is a concept including the following three cases. The first case is that the first layer is formed coming into contact with the semiconductor substrate. The second case is that the first layer is formed on at least one another layer such as an insulating layer, which has already been formed on the semiconductor substrate. The third case is that the semiconductor substrate itself if the first layer.

BEST MODE FOR CARRYING OUT THE INVENTION

The structure of a ferroelectric condenser, which is a portion of a memory device of a semiconductor device according to a first embodiment of the present invention, will first be explained. FIGS. 1A to 3C are cross-sectional views of the ferroelectric condenser of the memory device for explaining a method of fabricating the ferroelectric condenser section according to this first embodiment, wherein these views respectively show the primary fabricating process.

Figure 3A:
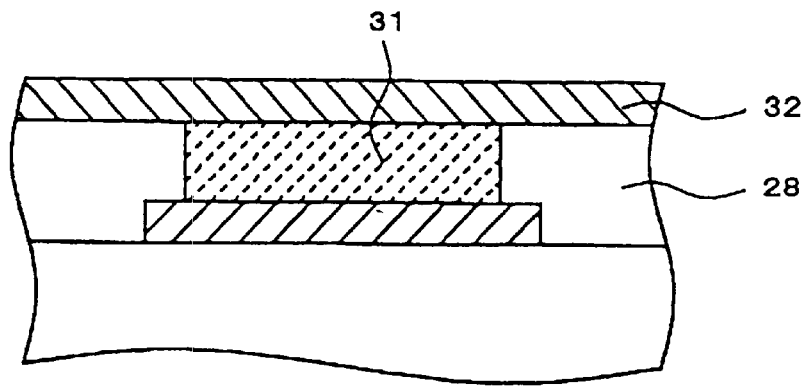
FIGS. 3A to 3C are cross-sectional views of a ferroelectric condenser for explaining the method of fabricating the ferroelectric condenser section according to the first embodiment of the present invention, wherein these views respectively show the primary fabrication process.
Figure 3B:
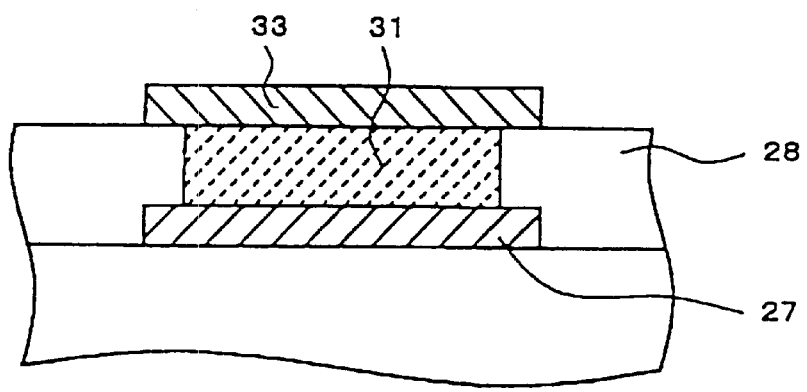
Figure 3C:
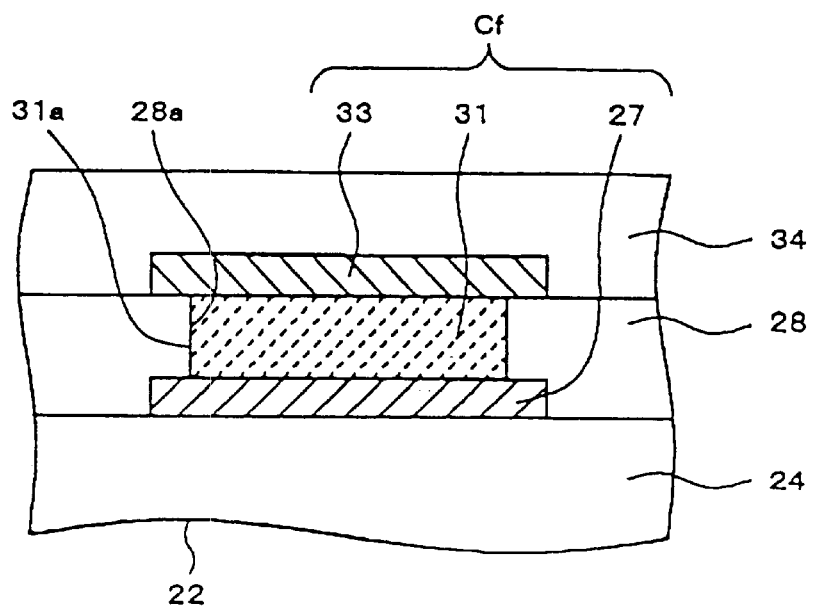

As shown in FIG. 3C, a ferroelectric condenser Cf is formed on an insulating film 24 that is provided on a substrate (not shown). The ferroelectric condenser Cf includes a lower electrode (first layer) 27, a ferroelectric section (oxide dielectric section) 31 and an upper electrode (second layer) 33, wherein the layers are placed in this order. An insulating film 34 is formed on the ferroelectric condenser Cf.

A side face 31a of the ferroelectric section 31 is formed in such a manner that it is substantially perpendicular to the ferroelectric section 31 concerned. An insulating film (insulating layer) 28 is formed to surround the side face 31a. A portion of this insulating film 28 and the ferroelectric section 31 are interposed between the lower electrode 27 and the upper electrode 33. Accordingly, it is possible to realize a ferroelectric condenser Cf having a predetermined capacity and occupying a minimum projected plan area. It is therefore further possible to obtain a memory device having a high grade of integration.

Figure 1A:
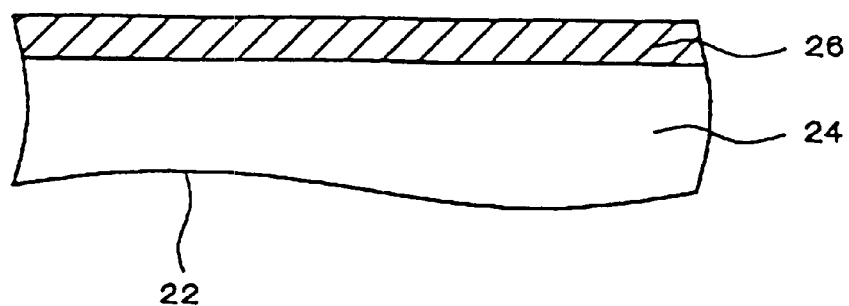
FIGS. 1A to 1C are cross-sectional views of a ferroelectric condenser for explaining a method of fabricating a ferroelectric condenser section according to a first embodiment of the present invention, wherein these views respectively show the primary fabrication process.

Referring to FIGS. 1A to 3C, a method of fabricating the ferroelectric condenser Cf will now be explained. As shown in FIG. 1A, a substrate 22, having CMOS and other elements (not shown), is provided. An insulating film 24 composed of BPSG (boro-phospho-silicate-glass) is formed on the CMOS elements. When platinum is deposited on the insulating film 24 by means of, for example, sputtering, a platinum layer 26 is formed. In this connection, it is preferable that an upper surface of the insulating film 24 is previously flattened using a method such as reflow or CMP.

Figure 1B:
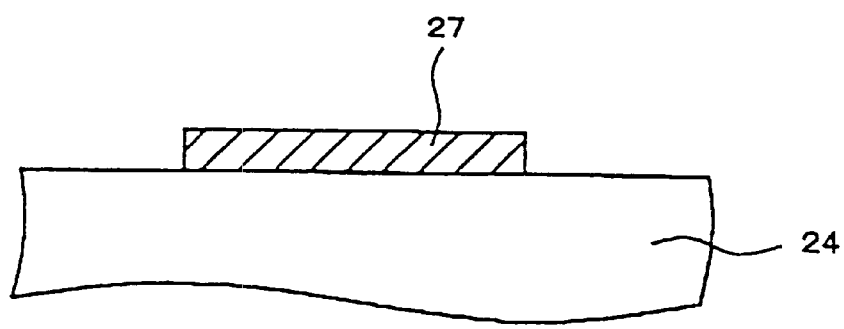

Next, as shown in FIG. 1B, a lower electrode 27 is formed into a predetermined shape by subjecting the platinum layer 26 to patterning. Patterning of the platinum layer 26 is conducted by forming a resist layer of a predetermined shape (not shown) on the upper surface of the platinum layer 26, and then etching the platinum layer 26 by RIE, using the resist layer as a mask.

Figure 1C:
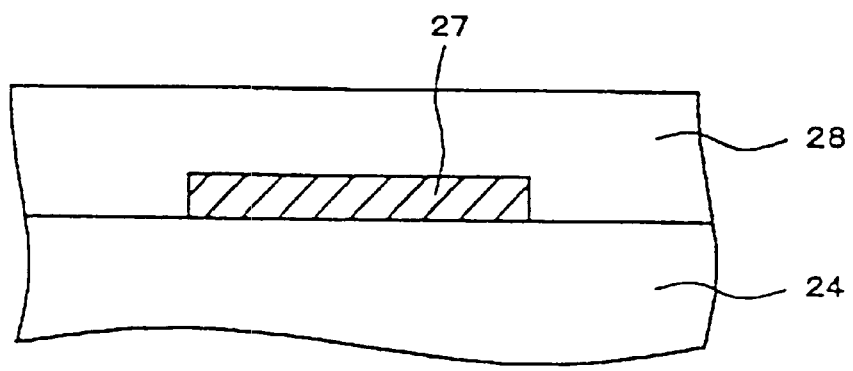

Next, as shown in FIG. 1C, the insulating film (insulating layer) 28 is formed so that the lower electrode 27 and the insulating film 24 are covered with the insulating film 28. The insulating film 28 is formed, for example, when silicon oxide is deposited by the CVD method (Chemical Vapor Deposition). In this embodiment, an upper surface of the deposited insulating film 28 is flattened.

The upper surface of the insulating film 28 may be flattened by any one of a number of methods. For example, a SOG (Spin On Glass) layer (not shown) may be formed on the insulating layer 28, so that irregularities on the upper surface of the insulating film 28 are filled, and the upper portion of the SOG layer then subjected to etchback. Alternatively, the upper surface of the insulating film 28 may be flattened using the CMP method.

Figure 2A:
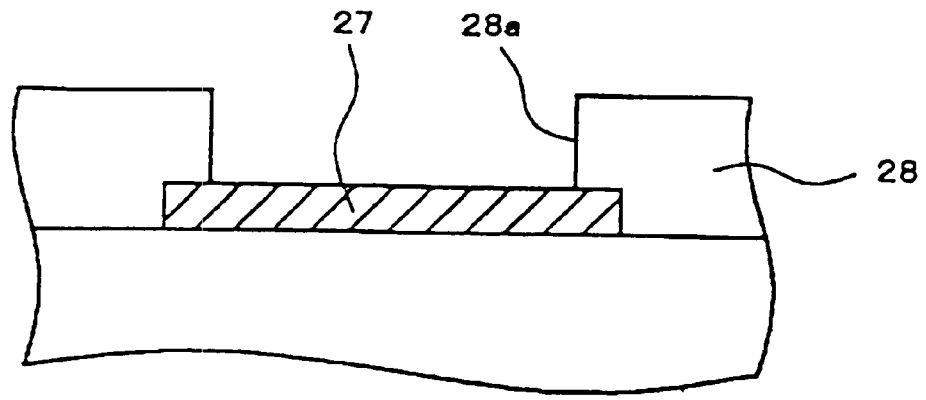
FIGS. 2A to 2C are cross-sectional views of a ferroelectric condenser for explaining the method of fabricating the ferroelectric condenser section according to the first embodiment of the present invention, wherein these views respectively show the primary fabrication process.

Next, as shown in FIG. 2A, a through hole 28a, which reaches the lower electrode 27, is formed in the insulating film 28. The through hole 28a is formed by placing a resist layer of a predetermined shape (not shown) on the upper surface of the insulating film 28, and then etching the insulating film 28 by the RIE method, using the resist layer as a mask.

Figure 2B:
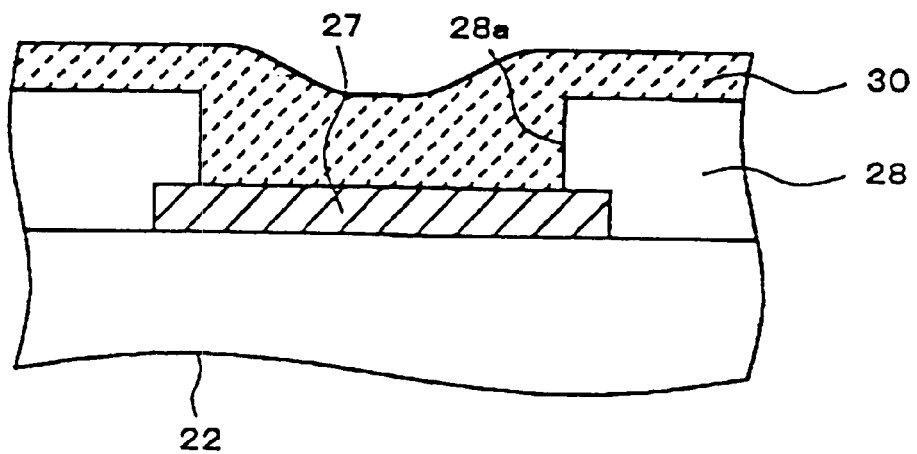

The ferroelectric layer 30 is then formed as shown in FIG. 2B. More specifically, a ferroelectric substance (oxide dielectric substance) composed of PZT is laid in the through hole 28a and on the insulating film 28 by the sol-gel method, the CVD method or sputtering. Due to the foregoing, the ferroelectric substance can be charged into the through hole 28a.

Figure 2C:
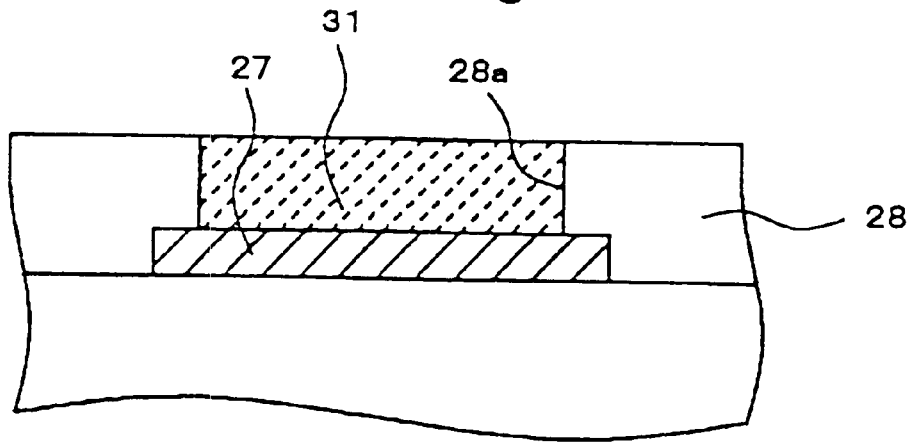

Next, as shown in FIG. 2C, the ferroelectric section (oxide dielectric section) 31 is formed by removing portions of the ferroelectric layer 30 that are located in areas other than the inside of the through hole 28a. This removal process may be accomplished using one of a number of methods. For example, the CMP method may be solely used. Alternatively, the upper portion of the ferroelectric layer 30 may be partially removed by etchback, and then finishing conducted by the CMP method.

When the upper surface of the insulating film 28 is flattened before the formation of the ferroelectric layer 30 as described above, the portions of the ferroelectric layer 30 that are located outside the through hole 28a can be easily and positively removed by the CMP method or etchback.

A contact area of the lower electrode 27 with the ferroelectric section 31 is determined by an opening area of the lower portion of the through hole 28a. Accordingly, fluctuation of the contact area is small. It is therefore possible to reduce fluctuation in the capacity of the ferroelectric condenser Cf shown in FIG. 3C.

Next, as shown in FIG. 3A, the platinum layer 32 is formed on the ferroelectric section 31 and the insulating film 28 when platinum is deposited by means of sputtering.

As shown in FIG. 3B, the upper electrode 33 is formed into a predetermined shape by subjecting the platinum layer 32 to patterning. Patterning of the platinum layer 32 is conducted by forming a resist layer of a predetermined shape (not shown) on the platinum layer 32 and then etching the platinum layer 32 by RIE, using the resist layer as a mask.

Before the upper electrode 33 is formed, the lower electrode 27 has already been formed as shown in FIG. 1B. Accordingly, during the process in which the upper electrode 33 is formed by etching the platinum layer 32 as shown in FIG. 3B, it is unnecessary to cut the platinum layer 26 (shown in FIG. 1A). In other words, it is unnecessary to dig down deeply in the etching process. Accordingly, irregularities on the upper surface of the device are not so remarkable. For the above reasons, the upper surface of the device can be easily flattened as shown in FIG. 3C.

As shown in FIG. 3B, the upper electrode 33 is formed so that it covers the overall upper surface of the ferroelectric section 31. Accordingly, when the upper electrode 33 is formed by etching, the ferroelectric section 31 does not suffer from a lattice defect or a reducing reaction, which are caused by etching.

A contact area of the ferroelectric section 31 with the upper electrode 33 is determined by an opening area of the upper portion of the through hole 28a. Accordingly, fluctuation of the contact area is small, and it is therefore possible to reduce fluctuation in the capacity of ferroelectric condenser Cf.

Finally, as shown in FIG. 3C, the insulating film 34 is formed to cover the upper electrode 33 and the insulating film 28. The insulating film 34 is formed, for example, by depositing silicon oxide using the CVD method.

When a ferroelectric substance is charged into the through hole 28a, the ferroelectric section 31, having the same shape as the internal shape of the through hole 28a, is formed. Thus, the ferroelectric section 31 can be formed into a predetermined shape without etching. It is therefore possible to avoid the occurrence of a lattice defect and a reducing reaction, which are caused by etching the ferroelectric section 31. As a result, the function of the ferroelectric section 31 is seldom deteriorated.

When the shape of the through hole 28a is determined, the shape of the ferroelectric section 31 is thus determined. Accordingly, as compared with a case in which the shape of the ferroelectric section 31 is determined by etching, fluctuation of the shape of the ferroelectric section 31 is reduced.

Therefore, it is possible to reduce a margin for absorbing the fluctuation and enhance a grade of integration of the device.

In the above embodiment, the upper surface of the insulating layer 28 is flattened before the formation of the through hole 28a. However, in the case where irregularities on the upper surface of the insulating layer 28 are not so remarkable, the process of flattening the upper surface of the insulating layer may be omitted.

A method of fabricating a ferroelectric condenser according to a second embodiment of the present invention will now be explained with reference to FIGS. 4A to 6B.

Figure 4A:
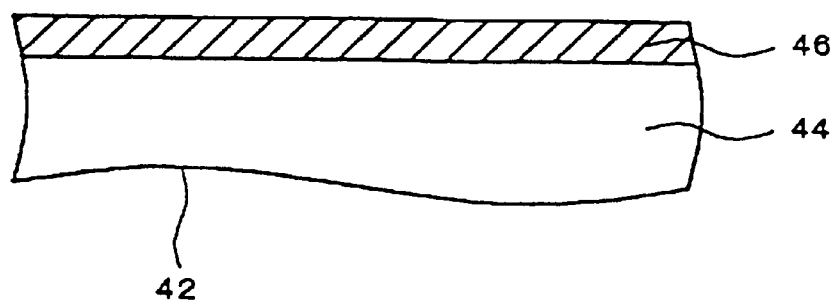
FIGS. 4A to 4C are cross-sectional views of a ferroelectric condenser for explaining a method of fabricating the ferroelectric condenser section according to a second embodiment of the present invention, wherein these views respectively show the primary fabrication process.

First, as shown in FIG. 4A, a substrate 42, having CMOS and other elements (not shown), is provided. An insulating film 44 composed of BPSG is formed on the CMOS elements. When platinum is deposited on the insulating film 44 by means of, for example, sputtering, a platinum layer (first layer) 46 is formed. In this connection, in the same manner as that of the aforementioned first embodiment, it is preferable that an upper surface of the insulating film 44 be previously flattened using a method such as reflow or CMP.

Figure 4B:
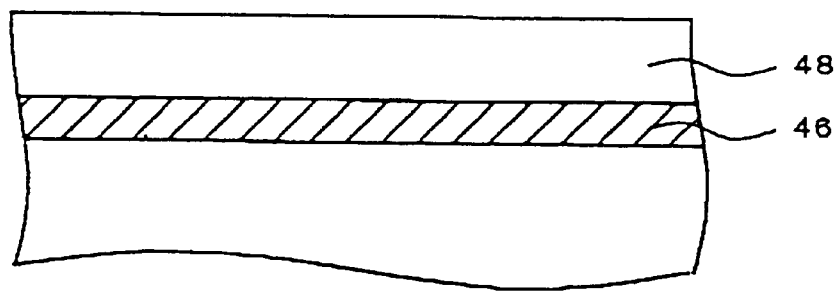

Next, as shown in FIG. 4B, an insulating film (insulating layer) 48 is formed on the platinum layer 46. The insulating layer 48 is formed, for example, by depositing silicon oxide using the CVD method. In this embodiment, the platinum layer 46 has not yet been subjected to patterning, and therefore, irregularities on the insulating layer 48 formed on the platinum layer 46 are not remarkable. Accordingly, unlike the aforementioned first embodiment, it is unnecessary to flatten the upper surface of the insulating film 48.

Figure 4C:
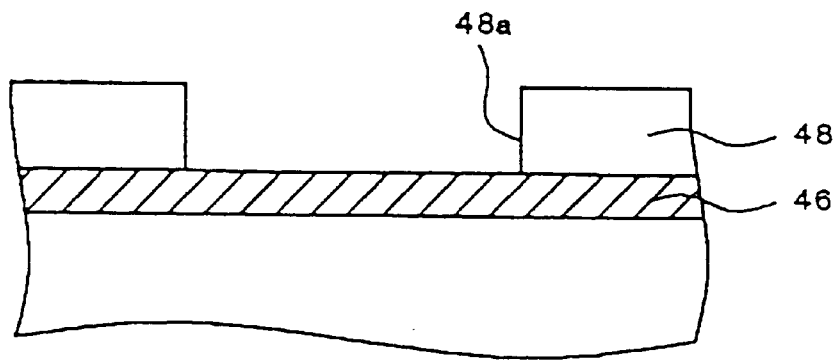

Next, as shown in FIG. 4C, a through hole 48a, which reaches the platinum layer 46, is formed on the insulating film 48. The through hole 48a is formed by placing a resist layer of a predetermined shape (not shown) on the upper surface of the insulating film 48, and then etching the insulating film 48 by the RIE method, using the resist layer as a mask.

Figure 5A:
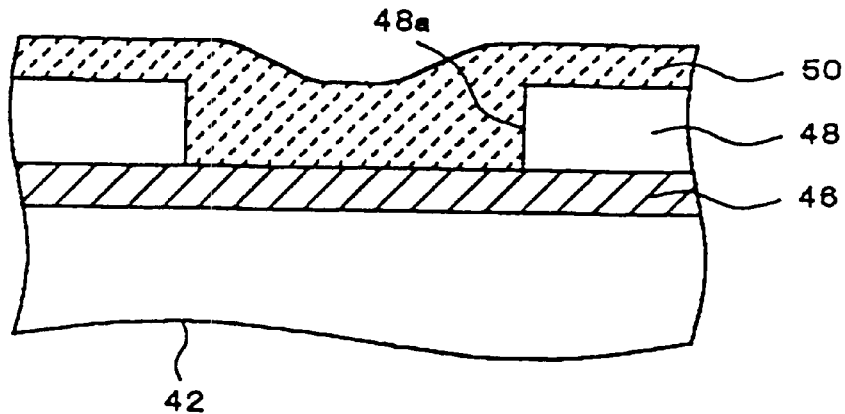
FIGS. 5A to 5C are cross-sectional views of a ferroelectric condenser for explaining the method of fabricating the ferroelectric condenser section according to the second embodiment of the present invention, wherein these views respectively show the primary fabrication process.

Next, as shown in FIG. 5A, a ferroelectric layer 50 is formed. When the ferroelectric layer 50 is formed, a ferroelectric substance (oxide dielectric substance) composed of PZT is laid in the through hole 48a and on the insulating film 48 by the sol-gel method, the CVD method or sputtering. Due to the foregoing, the ferroelectric substance can be charged into the through hole 48a.

Figure 5B:
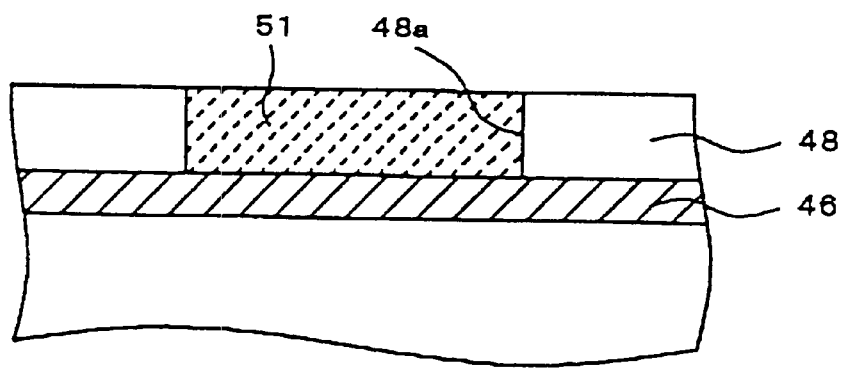

Next, as shown in FIG. 5B, a ferroelectric section (oxide dielectric section) 51 is formed by removing portions of the ferroelectric layer 50 that are located in areas other than the inside of the through-hole 48a. This removal process may be accomplished using any one of a number of methods. For example, the CMP method may be used solely. Alternatively, the upper portion of the ferroelectric layer 50 may be somewhat removed by etchback, and then finishing conducted by the CMP method.

As described above, irregularities on the upper surface of the insulating film 48 are not remarkable even if the flattening processing is not conducted. Therefore, portions of the ferroelectric layer 50 located outside the through hole 48a can be easily and positively removed.

Figure 5C:
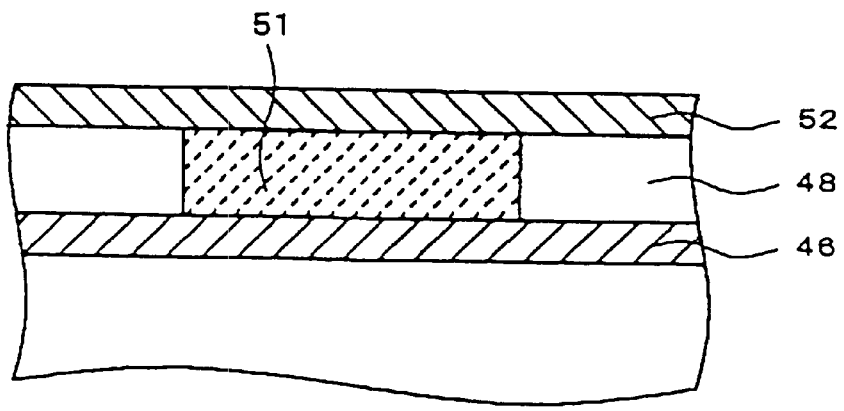
Figure 6A:
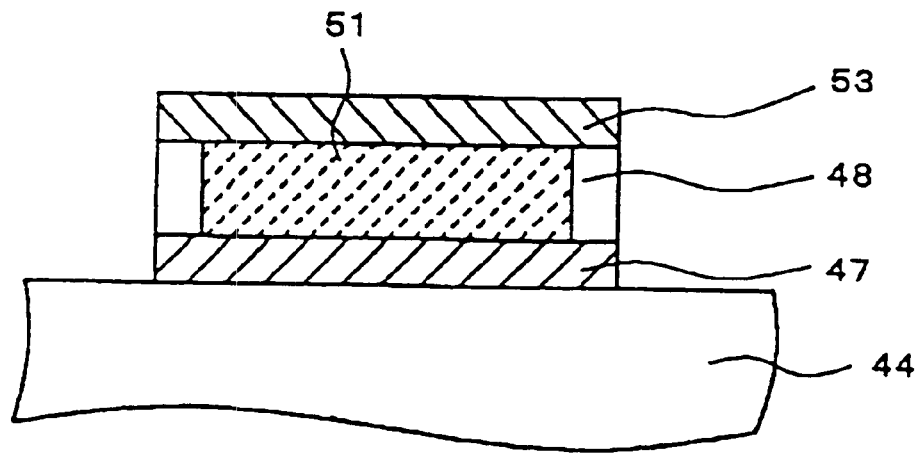
FIGS. 6A and 6B are cross-sectional views of a ferroelectric condenser for explaining the method of fabricating the ferroelectric condenser section according to the second embodiment of the present invention, wherein these views respectively show the primary fabrication process.

Next, a platinum layer (second layer) 52 is formed by depositing platinum on the ferroelectric section 51 and the insulating film 48 by means of sputtering as shown in FIG. 5C. When the platinum layer 52, insulating film 48 and platinum layer 46 are subjected to patterning of a predetermined shape as shown in FIG. 6A, an upper electrode 53 and a lower electrode 47 are formed. For example, when patterning is conducted by RIE, etching may be respectively conducted on the platinum layer 52, insulating film 48 and platinum layer 46 using different types of resist (not shown). Alternatively, etching may be conducted all at once on the three layers using only one type of resist (not shown).

Figure 6B:
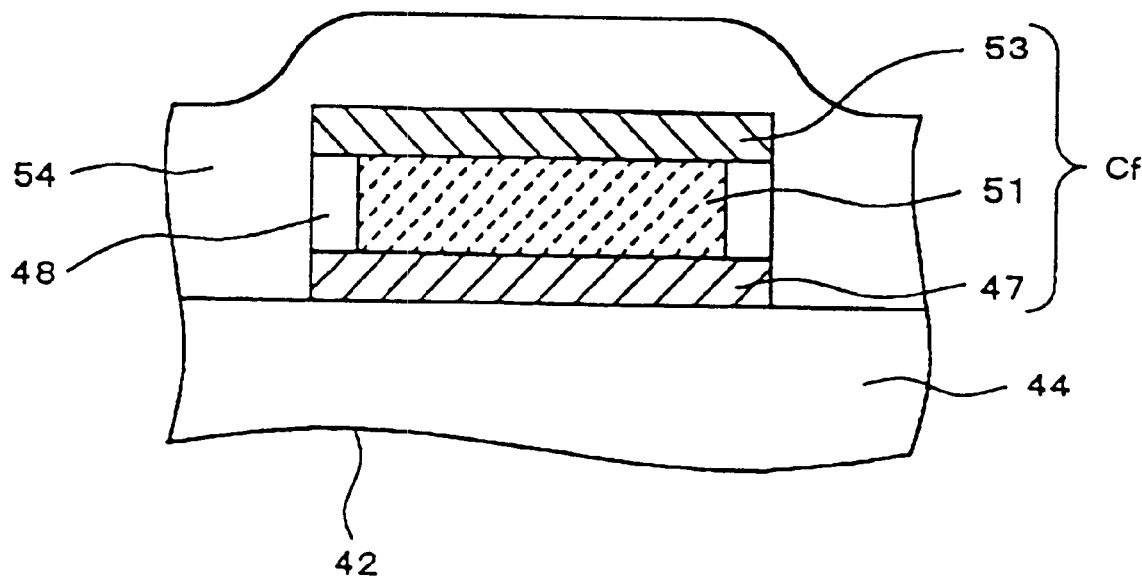
Figure 7A:
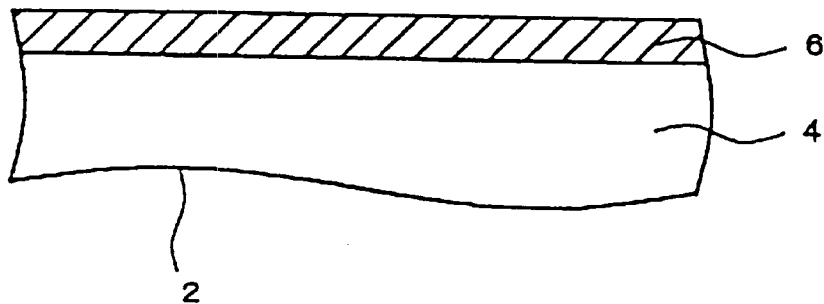
FIGS. 7A to 7C are cross-sectional views of a related ferroelectric condenser for explaining a related method of fabricating a ferroelectric condenser section, wherein these views respectively show the primary fabrication process.
Figure 7B:
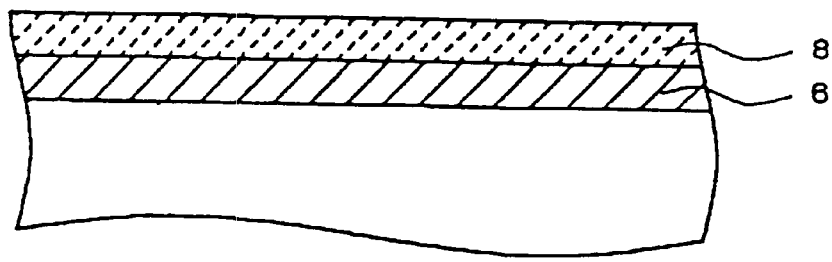
Figure 7C:
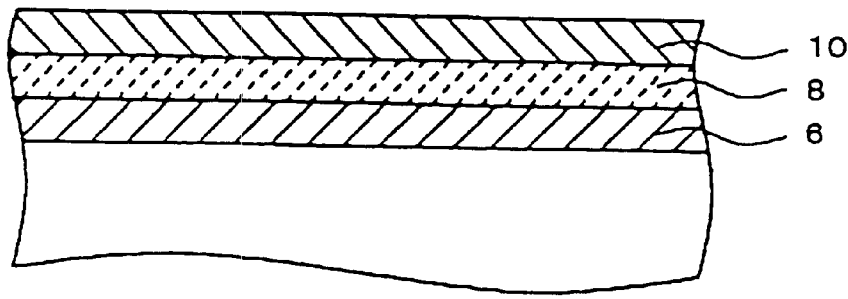
Figure 8A:
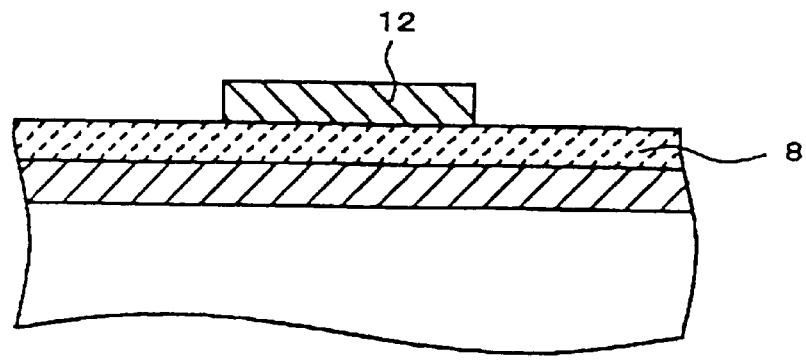
FIGS. 8A to 8C are cross-sectional views of a related ferroelectric condenser for explaining the related method of fabricating a ferroelectric condenser section, wherein these views respectively show the primary fabrication process.
Figure 8B:
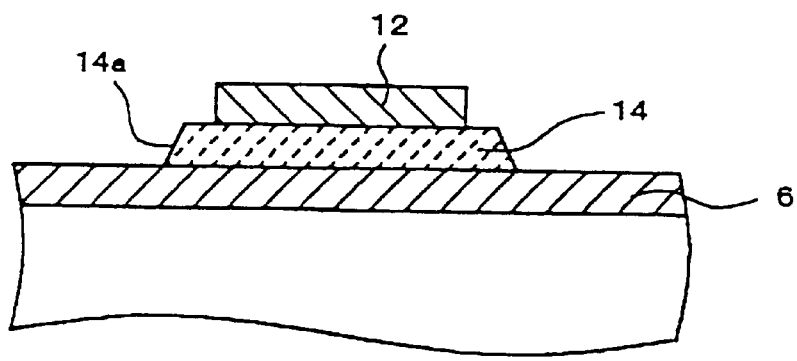
Figure 8C:
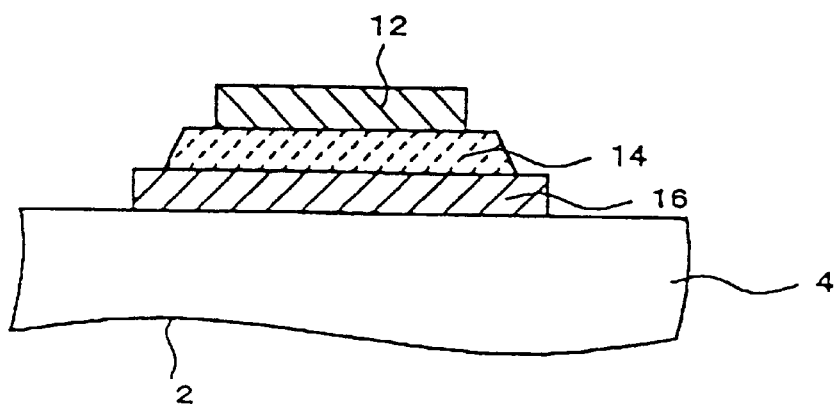

Finally, as shown in FIG. 6B, the insulating film 54 is formed to cover the upper electrode 53 and the insulating film 44. The insulating film 54 is formed, for example, by depositing silicon oxide using the CVD method.

In each embodiment described above, the second layer 33, 52 is cut to a size so that it covers the overall upper surface of the oxide dielectric section. However, it is possible to cut the second layer to a size so that a portion of the oxide dielectric section is not covered thereby.

Further, in each embodiment described above, the inner circumferential wall of the through hole is formed to be perpendicular to the insulating layer. However, it is possible to arrange the inner circumferential wall of the through hole in such a manner that it is not perpendicular to the insulating layer.

Even further, in each embodiment described above, the upper and lower electrodes are made of platinum. However, it should be noted that material of the upper and lower electrodes is not limited to platinum. For example, iridium or iridium oxide may be used for the upper and lower electrodes. Alternatively, not less than two conductor layers may be used to form the upper and the lower electrodes. For example, each one of combinations of $Pt/IrO_2$, $Pt/RuO_2$, $Ir/IrO_2$ or the like is applicable for the upper and lower electrodes.

The first and the second layers are composed of electrically conductive layers. However, it should be noted that the first and the second layers are not restricted to the above electrically conductive layers. For example, when the first or the second layer is composed of a semiconductor or an insulator, it is possible to apply the present invention. As a specific example, it is possible to apply the present invention to a structure in which a ferroelectric body is laid on a semiconductor substrate, and an upper electrode is placed on the ferroelectric body. In this case, a portion of the semiconductor substrate or the entire semiconductor substrate composes the first layer.

In each embodiment described above, PZT is used as the ferroelectric substance. However, it should be noted that the ferroelectric substance is not limited to the above specific material; for example, it is possible to use SBT or PLZT.

Further, the oxide dielectric substance is made of a ferroelectric substance. However, it should be noted that present invention is not limited to the above specific example. The present invention can be applied to any oxide having dielectricity.

It is possible to laminate not less than two oxide dielectric layers to compose one oxide dielectric layer.

In each embodiment described above, the semiconductor device is composed of a memory device. However, it should be noted that the present invention is not restricted to the above specific example. It is possible to apply the present invention to any semiconductor device.

INDUSTRIAL APPLICABILITY

As has been described heretofore that according to the present invention, there can be provided a semiconductor device and a method of fabricating the same, wherein a function of an oxide dielectric section, such as ferroelectric, is seldom deteriorated.

Furthermore, there can be provided a semiconductor device having an easily enhanced degree of integration, and a method of fabricating the same.

What is claimed is:

1. A method of fabricating a semiconductor device comprising the steps of:
    forming an insulating layer on a semiconductor substrate including a first conductive layer;
    forming a through hole in the insulating layer to the first conductive layer;
    laminating an oxide dielectric substance onto the insulating layer while filing the through hole therewith to form an oxide dielectric section therein;
    removing the oxide dielectric substance such that an upper face of the oxide dielectric section and an upper face of the insulating layer are made flush; and
    forming a second conductive layer such that a bottom face thereof is brought into contact with the upper faces of the oxide dielectric section and the insulating layer.

2. The method of fabricating a semiconductor device as set forth in claim 1 further comprising:
    forming the first conductive layer on an upper surface of the semiconductor substrate.

3. The method of fabricating a semiconductor device as set forth in claim 2 further comprising the steps of:
    patterning the first conductive layer before the step of forming the insulating layer.

4. The method of fabricating a semiconductor device as set forth in claim 1 further comprising the step of:
    planarizing an upper surface of the insulating layer before the step of filling the through hole with the oxide dielectric substance.

5. The method of fabricating a semiconductor device as set forth in claim 2 further comprising the step of:
    patterning the first conductive layer after the dielectric oxide dielectric section is formed.

6. The method of fabricating a semiconductor device as set forth in claim 1, 2, 3 or 4, further comprising the step of:
    patterning the second conductive layer so as to cover the entire upper surface of the oxide dielectric substance.

7. The method of fabricating a semiconductor device as set forth in claim 1, 2, 3 or 4, wherein an inner circumferential wall of the through hole and the insulating layer are angled relative to the vertical.

8. The method of fabricating a semiconductor device as set forth in claim 2, wherein the step of forming the first conductive layer includes the step of forming a first electrode on the upper surface of the semiconductor substrate in which a circuit element is formed.

9. The method of fabricating a semiconductor device as set forth in claim 1, 2, 3 or 4, wherein the first conductive layer is an impurity diffusion area formed on the upper surface of the semiconductor substrate.

10. The method of fabricating a semiconductor device as set forth in claim 1, 2, 3 or 4, wherein the first conductive layer includes a platinum layer.

11. The method of fabricating a semiconductor device as set forth in claim 1, 2, 3 or 4, wherein the first conductive layer includes an iridium layer.

12. The method of fabricating a semiconductor device as set forth in claim 1, 2, 3 or 4, wherein the first conductive layer is a two-layer film including a lower layer made of platinum and an upper layer made of $IrO_2$.

13. The method of fabricating a semiconductor device as set forth in claim 7, wherein the step of forming the through hole is conducted by RIE.

14. The method of fabricating a semiconductor device as set forth in claim 4, wherein the step of planarizing the upper surface of the insulating layer includes the steps of forming a SOG layer so as to fill recesses formed on the upper surface of the insulating layer by the SOG method and etching back an upper portion thereof.

15. The method of fabricating a semiconductor device as set forth in claim 4 or 14, wherein the step of laminating the oxide dielectric substance is conducted by the sol-gel method and the step of removing the substance is conducted by the etching-back.

16. The method of fabricating a semiconductor device as set forth in claim 4 or 14, wherein the step of laminating the oxide dielectric substance is conducted by the sputtering method and the step of removing the substance is conducted by the CMP method.

17. A semiconductor device comprising:

a first conductive layer formed on an upper surface of a semiconductor substrate;

an oxide dielectric section formed on the first conductive layer, an outer peripheral side face of which is surrounded by an insulating layer such that an upper face thereof is made flush with an upper face of the oxide dielectric section; and a second conductive layer, a lower face of which is brought into contact with the upper faces of the insulating layer and the oxide dielectric section.

18. The semiconductor device as set forth in claim 17, wherein the first conductive layer is an electrode including a platinum layer, and the first and second conductive layers sandwich the insulating layer between outer portions thereof.

19. The semiconductor device as set forth claim 18, wherein the first conductive layer includes a lower layer made of platinum and an upper layer made of $IrO_2$.

20. The semiconductor device as set forth in claim 18, wherein the oxide dielectric section is formed of one of PZT, SBT and PLZT, and a ferroelectric capacitor is formed by the first and second conductive layers and the oxide dielectric section.

21. The semiconductor device as set forth in claim 17, wherein the first layer is one of a source and a drain of a transistor, and a ferroelectric capacitor is formed of the first and second conductive layers and the oxide dielectric section.

* * * * *